(12) United States Patent
Okino

(10) Patent No.: US 6,258,511 B1
(45) Date of Patent: Jul. 10, 2001

(54) CHARGED PARTICLE BEAM EXPOSURE METHOD UTILIZING PARTIAL EXPOSURE STITCH AREA

(75) Inventor: Teruaki Okino, Kamakura (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/417,856

(22) Filed: Oct. 14, 1999

(30) Foreign Application Priority Data

Oct. 14, 1998 (JP) .................................................. 10-306401

(51) Int. Cl.⁷ ...................................................... G03C 5/00
(52) U.S. Cl. ............................................. 430/296; 430/942
(58) Field of Search ..................................... 430/296, 942

(56) References Cited

U.S. PATENT DOCUMENTS 6,162,581 * 12/2000 Nakasuji et al. ..................... 430/296

* cited by examiner

*Primary Examiner*—Christopher G. Young
(74) *Attorney, Agent, or Firm*—Chapman and Cutler

(57) ABSTRACT

An exposure method using a charged particle beam is used to improve the accuracy of stitching the patterns according to the divided pattern transfer. The exposure method according to the present invention comprises dividing the pattern into a plurality of subfields arranged in stripes; forming the subfields (41L) and (41R) laid around the boundary in the adjacent stripes (49L) and (49R), exposing the subfields (41L) and (41R) by half the exposure time amount, and overlapping the images of the patterns of the subfields (41L) and (41R) at substantially the same position on the wafer.

6 Claims, 2 Drawing Sheets

CHARGED PARTICLE BEAM EXPOSURE METHOD UTILIZING PARTIAL EXPOSURE STITCH AREA

BACKGROUND OF THE INVENTION

1. Field of the Invention

The present invention relates to a charged particle beam exposure method used in the lithography process of semiconductor integration circuits and the associated mask. In particular, the present invention relates to a charged particle beam exposure method employing an electron beam and an ion beam according to the divided pattern transfer method to improve the accuracy of stitching of the patterns.

2. Description of the Related Art

The exposure method employing the charged particle beam will be explained as related art. The current charged particle beam exposure method has a high accuracy but a low throughput. To solve this problem, a variety of techniques have been developed including a partial pattern projection exposure method e.g. a cell projection, a character projection and a block exposure which is utilized at present. According to the partial pattern projection exposure method, a small pattern, e.g., squares of 5 microns, is projected as an exposure unit. If a small repetitive pattern of the circuit require exposure, such as squares of 5 micron, then each small pattern is exposed one after another using a mask on which different kinds of small repetitive patterns are formed. However, if some of the patterns are not repetitive, they are exposed according to the variable shaped beam exposure method.

A new charged particle beam reduction projection device is proposed according to the charged particle beam exposure method that enables a much higher throughput than that of the conventional pattern projection exposure method. This is possible due to the following process: a mask is prepared on which the entire pattern of a semiconductor chip is formed; following this the charged particle beam is irradiated onto a given area of the mask, and the image of a pattern laid within the area is transferred in reduction by a projection lens.

However, irradiating the charged particle beam simultaneously to the whole area of the mask does not enable accurate transfer of the pattern, due to aberrations. In addition, it is difficult to prepare the original plate of the mask. As a result of these problems, a method has recently been studied where a die (a chip on a wafer) or a plurality of dies are not exposed simultaneously; instead, small areas divided from the pattern (we call "subfield") are exposed using an optical system with an optical field which does not, however, cover the whole chip. This method will be referred to as the divided pattern transfer method. The exposure is carried out by adjusting the focus of the image of a subfield to be projected onto the exposure surface thus minimizing aberrations such as distortion of the subfield for each individual subfield. This enables an exposure to have an excellent resolution and accuracy within a large area compared with a simultaneous transfer of the entire die.

Using the charged particle beam exposure method, the areas that can be simultaneously exposed, called the unit exposure areas, are smaller than that of the optical exposure method employing visible or ultraviolet light. Accordingly, since it is difficult to simultaneously expose the entire pattern of a semiconductor chip, it is necessary to stitch exposed portions divided from the pattern. The stitching might be accompanied by a gap or displacement, which may be reduced by improving the accuracy of pattern transfer.

Meanwhile, the mask, which is the original plate used for the wafer exposure, is also prepared by the charged particle beam exposure. To fabricate the mask, adjusting, e.g., moving and overlapping, the boundary of the pattern is possible.

This method improves the accuracy of the stitching, but reduces the throughput owing to the repeated exposures necessary. The reduction in the throughput does not affect the mask production seriously, but it affects the wafer production. Accordingly, this method is not available for the wafer exposure.

SUMMARY OF THE INVENTION

It is therefore an object of the present invention to provide a charged particle beam exposure method employing the electron beam and the ion beam according to the divided pattern transfer method to improve the stitching accuracy of the patterns.

According to an aspect of the present invention, a charged particle beam exposure method is provided using a charged particle beam exposure device. This includes an illumination optical system for illuminating a mask with a charged particle beam and a projection optical system for projecting the charged particle beam passing through the mask onto a sensitive substrate. The method also includes the steps of dividing a pattern to be transferred onto an exposure surface of the sensitive substrate into a plurality of subfields; classifying the plurality of subfields into a plurality of stripes having widths smaller than the deflection field of the optical system which is covered by deflection of the charged particle beam; arranging the plurality of stripes comprising a plurality of subfields on the mask; upon completion of exposure of a stripe, placing the next stripe in the deflection field by uniformly moving the mask and the substrate; illuminating the mask by deflecting the illumination beam for each subfield; and transferring the pattern to the exposure surface by stitching the images of the subfields on the exposure surface. The charged particle beam exposure method comprises forming a subfield having the same pattern at the ends of adjacent two stripes, and exposing each subfield by approximately half of the exposure amount in such a fashion to ensure that the images of the subfields substantially overlap on the exposure surface when the images are stitched.

When the chip pattern is divided into a plurality of subfields having a divided pattern and the subfields are classified into a plurality of stripes, the subfield pattern laid around the boundary is formed in both adjacent stripes on the mask. That is, the subfields laid around the boundary have the same pattern. When exposed on the sensitive substrate (e.g. a wafer), the patterns in such subfields overlap at substantially the same position on the wafer for exposure. The exposure is provided by approximately half the exposure amount. Consequently, undertaking two exposures using half of the exposure amount is equal to the regular exposure amount. This averages error in positioning for stripe exposure, thus smoothing the stitching of the stripes on the wafer.

In the above explanation, the substantially same position represents the position with acceptable error for stitching. Approximately half the exposure amount means that the first exposure amount is almost equivalent to half of the regular exposure amount, a second exposure amount is also almost equivalent thereto, and the sum of the first and second exposure amounts is equivalent to the regular exposure amount. That is, it is not necessary that both the first and second exposure amounts are precisely equivalent to half the regular exposure amount; however, it is necessary that the sum of the first and second exposure amounts is roughly equivalent to the regular exposure amount. To obtain the effect of the present invention, it is necessary to keep both the first and the second exposure amounts at approximately half of the regular exposure amount.

According to another aspect of the present invention, a charged particle beam exposure method is provided using a charged particle beam exposure device comprising an illumination optical system for illuminating a mask with a charged particle beam and a projection optical system for projecting the charged particle beam passing through the mask onto a sensitive substrate. The process includes: dividing a pattern to be transferred to an exposure surface of the sensitive substrate into a plurality of subfields; classifying the plurality of subfields into a plurality of stripes having widths smaller than the deflection field of the optical system; arranging the plurality of stripes comprising a plurality of subfields on the mask; upon completion of exposing a stripe, positioning the next stripe in the deflection field by moving the mask; illuminating the mask by deflecting the illumination beam for each subfield; and transferring the pattern to the exposure surface by stitching the images of the subfields on the exposure surface. The charged particle beam exposure method comprises: exposing a subfield having a pattern at a boundary of two adjacent stripes twice by approximately half the exposure amount in such a fashion to ensure that the image of the subfield is overlapped at substantially the same position on the sensitive substrate.

In this case, the subfield pattern at the boundary of a stripe is not formed in both adjacent stripes but in one stripe, and a subfield at the boundary is exposed by half the exposure amount when each of two adjacent stripes is exposed on the sensitive substrate. Specifically, this subfield belongs to both stripes. The error in positioning a stripe for exposure is averaged, thus smoothing the stitching of the stripes.

According to another aspect of the present invention, there is an exposure method for illuminating a mask with a charged particle beam to project the charged particle beam passing through the mask onto a sensitive substrate. This method includes the following steps: dividing the pattern to be transferred to the exposure surface of the sensitive substrate into a plurality of subfields; forming the plurality of subfields on the mask; and transferring the pattern to the exposure surface by stitching the images of the subfields on the exposure surface. The charged particle beam exposure method comprises: selectively arranging at least a portion of the pattern laid around the boundary of the subfields into one of the adjacent subfields on the mask.

According to still another aspect of the present invention, there is an exposure method of illuminating a mask with a charged particle beam to project the charged particle beam passing through the mask onto a sensitive substrate. This method includes the following steps: dividing a pattern to be transferred to the exposure surface of the sensitive substrate into a plurality of subfields; forming the plurality of subfields on the mask; and transferring the pattern to the exposure surface by stitching the images of the subfields on the exposure surface. The charged particle beam exposure method comprises: preparing a margin area on the periphery of the subfield; and selectively arranging at least a portion of the pattern laid in the margin area into one of the adjacent subfields on the mask.

Forming a small pattern in correspondence with the subfield in which the pattern to be connected to the small pattern is laid can prevent the small pattern from remaining around the boundary. If the present invention is not applied, this small pattern may remain around the boundary. In addition, with respect to a rather short and thin pattern like a gate of FET, forming the entire pattern in either subfield does not allow the pattern to exist in both subfields. This prevents failure in manufacturing the mask and inaccuracy in transfer of small patterns.

BRIEF DESCRIPTION OF THE DRAWINGS

FIG. 4 is an explanatory diagram of the exposure method which improves the stitching of the subfields by preparing the margin area in the periphery of the subfields on the mask.

DETAILED DESCRIPTION OF THE INVENTION

<First Embodiment>

The preferred embodiments of the present invention is now described with reference to the accompanying drawings.

Figure 2:
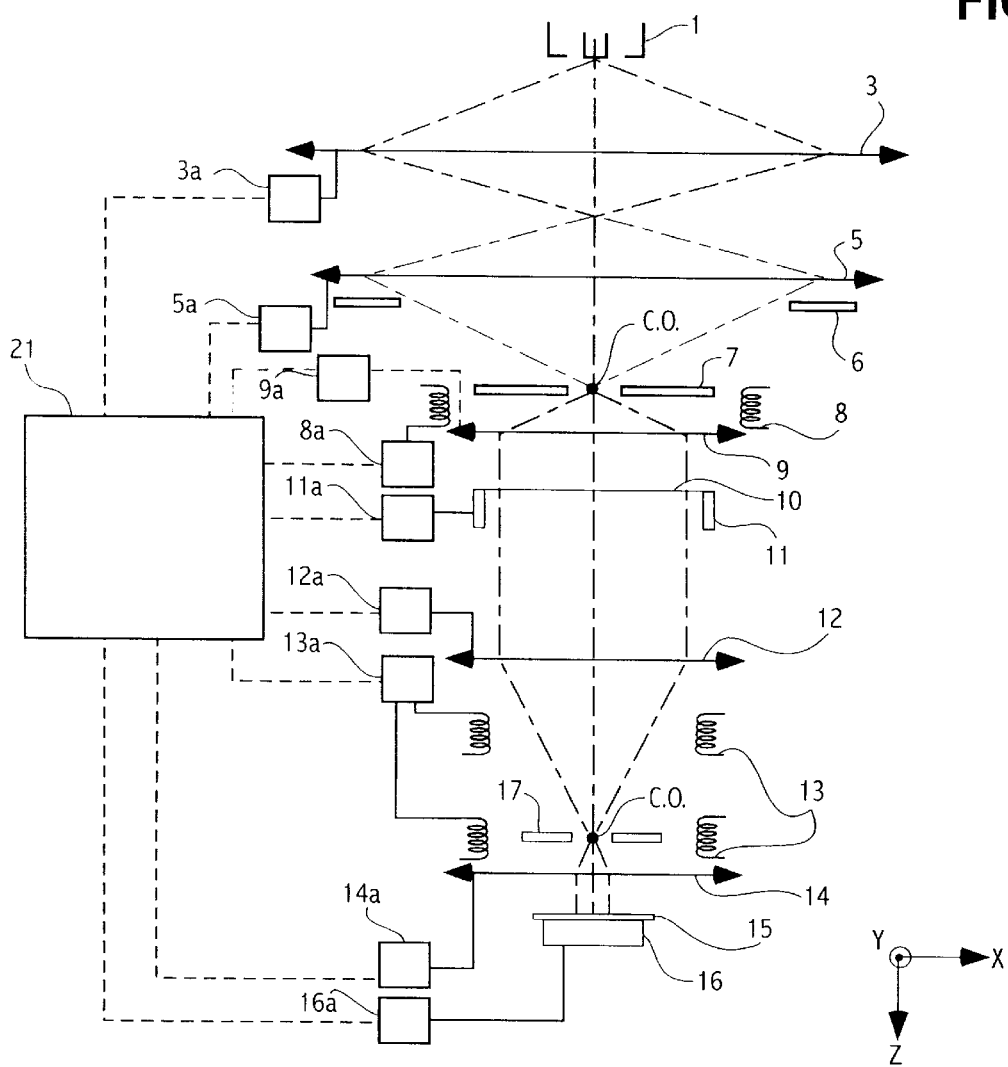
FIG. 2 schematically shows the projection system and the control system in the whole optical system of the charged particle beam projection exposure device according to the divided pattern transfer method.

First, the electron beam will be explained. FIG. 2 schematically shows the imaging system and the control system in the optical system of the electron beam projection exposure device according to the divided pattern transfer method.

The electron gun 1 is deposited at the top of the optical system to irradiate the electron beam downward. Two-stage condenser lenses 3 and 5 are positioned under the electron gun 1. The electron beam projects the cross-over C.O. onto the blanking aperture 7 via the condenser lenses 3 and 5.

Under the condenser lens 5 the rectangular aperture 6 is provided. The rectangular aperture 6, which is an illumination beam forming aperture, allows only the illumination beam which illuminates a subfield or a unit exposure area to pass. Specifically, the rectangular aperture 6 forms the illumination beam into a square so as to illuminate the subfields on the mask a little larger than 1 millimeter. The image of the rectangular aperture 6 is projected to the mask by lens 9.

Under the rectangular aperture 6, the blanking aperture 7 is arranged at the position where the cross-over C.O. is formed. Additionally, the illumination deflector 8 is provided under the blanking aperture 7. The illumination deflector 8 sequentially scans the illumination beam approximately in the X direction of FIG. 2 to illuminate each subfield of the mask laid within the field of the illumination optical system. Under the illumination deflector 8 is placed a condenser lens 9. The condenser lens 9 renders the electron beam to be parallel to irradiate it to the mask 10, thus projecting the image of the rectangular aperture 6 onto the mask 10.

The mask 10 appears to include only one subfield with respect to the optical axis in FIG. 2; however, it actually includes a large number of subfields in the plane, or X-Y plane perpendicular to the optical axis. On the mask 10 is formed a pattern used for specifying a semiconductor device chip, e.g. a chip pattern. The illumination of each subfield in the field of the illumination optical system is principally due to the illumination deflector 8 deflecting the electron beam.

The mask 10 is mounted on the mask stage 11 movable in the X-Y direction. The wafer 15, which is a sensitive substrate, is mounted on the wafer stage 16 movable in the X-Y direction. Scanning synchronously and inversely in the Y direction by moving the mask stage 11 and the wafer stage 16 sequentially exposes a large number of subfields arranged in the Y direction on the chip pattern while subfields arranged in the X direction are exposed using a deflector. A position measuring system employing a laser interferometer is provided on both the mask stage 11 and the wafer stage 16 in order to accurately position and stitch on the wafer 15 the reduced images of the subfields of mask 10. The projection lenses 12 and 14, and the deflector 13 are positioned under the mask 10. Once the illumination beam is irradiated to a subfield of the mask 10, the electron beam passing through the white portion of the mask 10, which is a hole portion of the stencil mask, or a portion of the scattering membrane mask with no high scattering membrane, is directed to the projection lenses 12 and 14. It is then accurately projected to the predetermined position on the wafer 15 through deflection by the illumination deflector 13. There is a proper resist applied on the wafer 15. The electron beam is applied to the resist, whereby the reduced image of the pattern on the mask 10 is transferred onto the wafer 15. The wafer 15 is placed on the wafer stage 16 movable in the plane.

At the point which divides the distance between the mask 10 and the wafer 15 by the reduction ratio, the cross-over image C.O. is formed, and the contrast aperture 17 is placed at this position. The contrast aperture 17 prevents the electron beam scattered by the black portion of the mask 10 from reaching the wafer 15. The black portion of the mask 10 is a non-hole portion of the stencil mask, or the high scatter membrane portion of the scatter membrane mask.

The lenses 3, 5, 9, 12, and 14, and the deflectors 8 and 13 are controlled by the controller 21 via the respective coil power supplies 3a, 5a, 9a, 12a, 14a, 8a, and 13a. The mask stage 11 and the wafer stage 16 are also controlled by the controller 21 via the respective stage drive motor controllers 11a and 16a.

In summary, the subfields on the mask 10 are illuminated one after another, where the image of each subfield is projected to the predetermined position on the wafer 15, and the reduced images of the subfields are accurately stitched. As a result, the reduced image of the whole chip pattern is transferred onto the wafer 15.

Figure 1:
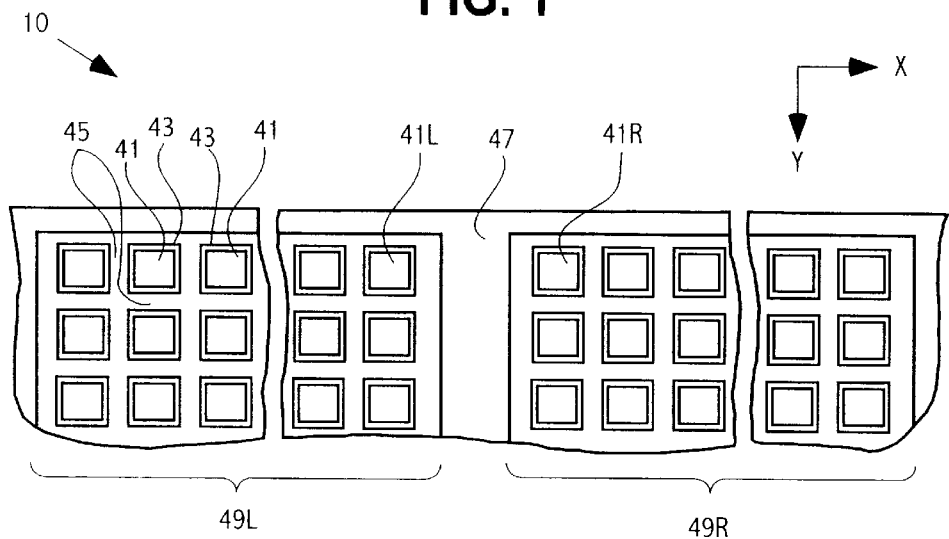
FIG. 1 is a plan view showing the structure of the mask used for the charged particle beam exposure of the first embodiment.

Next, the mask used for the electron beam projection exposure of the divided pattern transfer method is described in detail referring to FIG. 1.

FIG. 1 is a plan view schematically showing the structure of the mask used for the electron beam exposure of the first embodiment.

The mask 10 incorporates a silicon thin film, which is a membrane of approximately 0.1–3.0 microns in thickness. As described above, there are two kinds of mask 10: the scatter mask provided with the scatter body pattern of a heavy metal on the membrane, and the scattering stencil mask provided with the aperture corresponding to the pattern in the membrane. The former membrane serves as a weak scattering body while the latter serves as a strong scattering body.

Each subfield 41 has a pattern area corresponding to an exposure unit area, which is a square on the mask 10 with sides of 0.5–5 millimeters. The area of the reduced pattern image which is the reduced image of a pattern of a subfield projected onto the wafer 15, as an image field, is a square of 0.1–1 millimeter according to the reduction ratio.

At the circumference of each subfield 41 is laid the skirt 43 shaped like a picture frame. The skirt 43 includes a scattering body having a larger scattering angle to remove the illumination beam laid out of each subfield. The dimension of the illumination should be slightly larger than that of the subfield in order to provide a uniform illumination. The skirt scatters the electron beam incident on the skirt to prevent heat. More correctly, the skirt 43 scatters the illumination beam incident on the outer side of the subfield and the contrast aperture 17 removes the scattered beam. The skirt 43 is 10–100 microns in width. The strut 45, which surrounds each skirt 43 and is shaped like a lattice, is a girder of 0.5–1 millimeter in thickness to maintain the mechanical strength of the membrane. The strut 45 is approximately 100 microns in width.

A plurality of subfields 41 are lined in the X direction to form a line as a group or a scanning band, and further a plurality of lines are arranged in the Y direction to form a stripe 49. The width of the stripe 49 corresponds to the width of the= field that the electron optical system is capable of deflecting. A plurality of stripes 49 are lined in the X direction. The strut 47, which is a wide girder, laid between adjacent stripes 49 acts to reduce the bending or flexure of the whole mask 10. The width of the strut 47 is several millimeters. The strut 47 is not essential to the invention.

Exposure of the lines in the X direction is carried out through the electron beam deflection while exposure of the lines in the Y direction is carried out through the continuous stage scanning. The stage is intermittently transferred from a stripe 49 to an adjacent stripe 49.

On the wafer, the non-pattern areas, e.g. skirt 43 and strut 45, are cancelled while the pattern of the subfields are stitched for the whole chip. The reduction ratio of transfer is preferably 1/4 or 1/5. Since the chip on the wafer is 25 millimeters by 40 millimeters in 16G DRAM, the whole entire mask is 120–230 millimeters by 150–350 millimeters.

In FIG. 1, the left stripe 49L and the right stripe 49R are adjacent. The stripe 49L includes a subfield 41L on the right side while the stripe 49R includes a subfield 41R on the left side. The patterns of the former and latter subfields 41L and 41R are identical. On the wafer to which both the stripe 49L and the stripe 49R are transferred, the subfield 41L and the subfield 41R are exposed at in the same position on the wafer. The exposure amount or the exposure time for each of the subfields 41L and 41R is half the original one. Controlling the exposure time is possible using the blanking deflector and the aperture provided in the illumination optical system of the exposure device.

The pattern laid at the stripe boundary is exposed using both stripes on the reticle, which smoothes the stitching of the pattern of the stripes on the wafer.

<Second Embodiment>

The second embodiment of the present invention will be described below.

Figure 3:
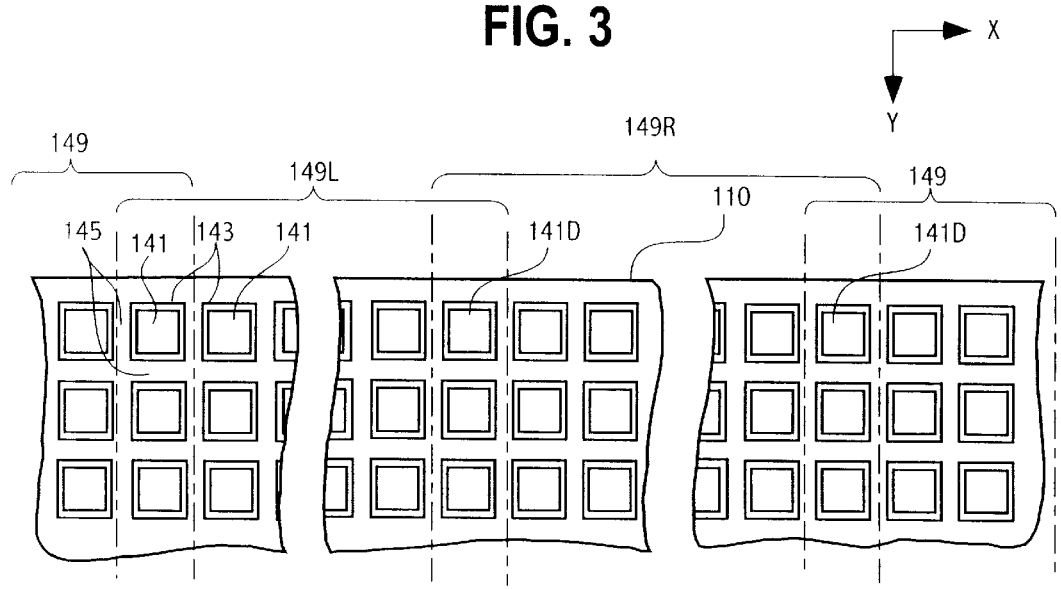
FIG. 3 is a plan view showing the mask used for repeatedly exposing the subfield laid around the boundary between the adjacent stripes in exposing the stripes.

FIG. 3 is a plan view showing the mask used for exposing a subfield around stripe boundary twice when two adjacent stripes are exposed. Unlike the first embodiment, no wide strut lies between the adjacent stripes 149 on the mask 110, and the boundary between these is unclear. However, the adjacent stripes 149L and 149R share the subfield 141D. The subfield 141D is exposed using half the exposure time amount at the same position on the wafer and subfields 141D is exposed by both of the stripe 149L and the stripe 149R. In this way, the stitching of these stripes is improved.

<Third and Fourth Embodiments>

The third and fourth embodiments will be described below. Similar to the first and second embodiments, the object of these embodiments is to improve the stitching of the subfields.

Figure 4A:
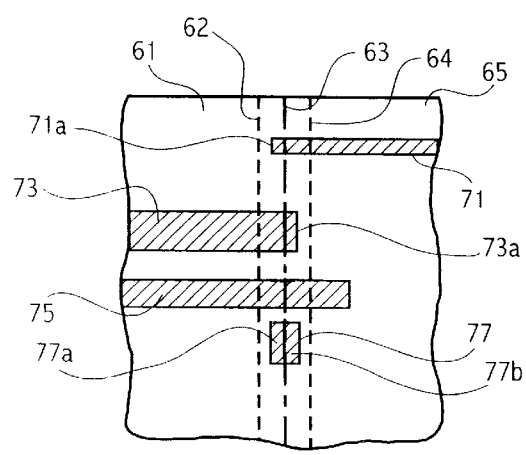
FIG. 4(A) is a plan view showing the pattern to be formed.
Figure 4B:
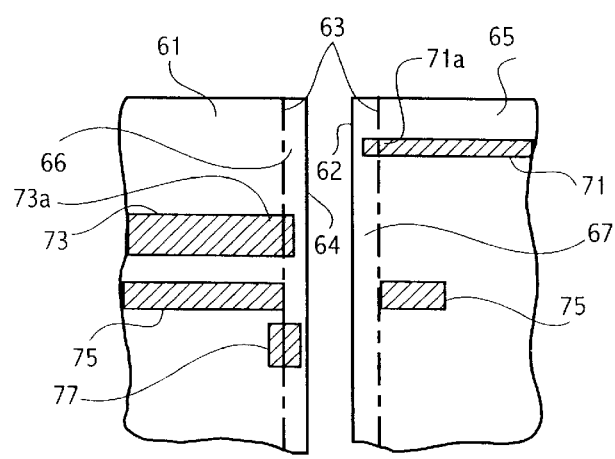
FIG. 4(B) is a plan view showing the structure of the mask.

FIG. 4 shows how the stitching is improved by providing the margin area on the periphery of the subfields in the mask,. wherein FIG. 4(A) is a plan view showing the pattern to be transferred while FIG. 4(B) is a plan view showing the structure of the mask.

In FIG. 4(A), the line patterns 71, 73, and 75 are laid over, and the small rectangular pattern 77 like a gate portion of DRAM is also laid. The boundary 63 is denoted by the dotted line. Here, the boundary 63 represents a boundary when a margin area is not provided and further, a partial pattern or a pattern portion in the margin area is not selectively arranged. All the line patterns 71, 73, and 75 cross the boundary 63. Specifically, both the left portion 71a of the line pattern 71, and the right portion 73a of the line pattern 73 have small portions that slightly protrude from across the boundary 63. The center of the rectangular pattern 77 is laid exactly on the boundary 63. In this case, dividing those patterns along the boundary 63 creates the small residual pattern portions 71a, 73a, and 77b, which might lead to failure of the mask or infidelity of the pattern transferred.

To solve these problems, as shown in FIG. 4(B), on the periphery of each of the subfields 61 and 65 on the mask are provided the margin areas 66 and 67. The line pattern 71, which includes the left portion 71a, is formed in the right subfield 65. The line pattern 73, which includes the right portion 73a, is formed in the left subfield 61. The line pattern 75 is laid over both the subfields 65 and 61, crossing the boundary 63. That is to say, the line pattern 75 can not exist within either subfield. Accordingly, the line pattern 75 is formed in both the subfields 65 and 61. The whole rectangular pattern 77 is formed in the left subfield 61. The subfields 61 and 65 are exposed to overlap the margin areas 66 and 67 on the wafer.

In this way, both the subfields have no small pattern portions around the boundary. The small pattern portions might be completely reproduced in manufacturing the mask or transferring the whole pattern. If the pattern for a gate, which is fine and rather short, is divided at the boundary, a gap arises in the stitching, which leads to infidelity of the pattern; accordingly, positioning the small portions in either subfield can prevent the failure.

As described above, in accordance with the present invention, the stitching around the boundary between adjacent subfields becomes smoothed. No small pattern is laid around the boundary, which increases the likelihood of maintaining fidelity in producing the pattern and the fidelity of the small pattern.

What is claimed is:

1. A charged particle beam exposure method, comprising following steps:

providing a charged particle beam exposure device including an illumination optical system to illuminate a mask with an illumination charged particle beam, and a projection optical system to project said charged particle beam passing through a mask onto a sensitive substrate;

dividing a pattern to be transferred to an exposure surface of said sensitive substrate into a plurality of subfields;

classifying said plurality of subfields into a plurality of stripes;

arranging said plurality of stripes on said mask;

exposing a stripe positioned in a field of said projection optical system with an exposure time amount;

upon completion of exposure moving said mask to place next stripe to be exposed into said field;

deflecting said illumination beam in the exposed stripe to illuminate each subfield of said mask; and stitching the images of said subfields in order to obtain a complete image of said pattern on said exposure surface, wherein the method further includes forming on the mask at the ends of two adjacent stripes two end subfields having the same portion of the pattern; and exposing each of the end subfields by approximately half the exposure time amount in such a fashion that images of said two end subfields overlap on substantially the same position on said exposure surface which is in a stitching part of the images of said two stripes.

2. A charged particle beam exposure method, comprising following steps:

providing a charged particle beam exposure device including an illumination optical system to illuminate a mask with an illumination charged particle beam, and a projection optical system to project said charged particle beam passing through a mask onto a sensitive substrate;

dividing a pattern to be transferred to an exposure surface of said sensitive substrate into a plurality of subfields;

classifying said plurality of subfields into a plurality of stripes;

arranging said plurality of stripes on said mask;

exposing a stripe positioned in a visual field of said projection optical system with an exposure amount;

upon completion of exposure moving said mask to place next stripe to be exposed into said visual field;

deflecting said illumination beam to illuminate each subfield of said mask; and stitching the images of said subfields in order to obtain a complete image of said pattern on said exposure surface, wherein the method further includes exposing twice a subfield having a portion of said pattern laid on a boundary of two adjacent stripes by approximately half the exposure time amount to provide two images of said subfield from two different, but neighboring stripes in such a fashion that said two images of said subfield overlap at substantially the same position on said sensitive substrate.

3. An exposure method of illuminating a mask with a charged particle beam to project said charged particle beam passing through said mask onto a sensitive substrate, comprising steps of:

dividing a pattern to be transferred onto an exposure surface of said sensitive substrate into a plurality of subfields;

forming said plurality of subfields on said mask; and transferring said pattern onto said exposure surface by exposing said subfields and stitching images of said subfields on said exposure surface, wherein when forming said subfields on said mask, selectively arranging at least a portion of said pattern laid around a boundary of said subfields within one of adjacent subfields.

4. An exposure method of illuminating a mask with a charged particle beam to project said charged particle beam passing through said mask onto a sensitive substrate, including:

dividing a pattern to be transferred to an exposure surface of said sensitive substrate into a plurality of subfields;

forming said plurality of subfields on said mask; and transferring said pattern to said exposure surface exposing the subfields and stitching images of said subfields on said exposure surface, wherein forming a margin area on periphery of said subfields; and selectively arranging at least a portion of said pattern laid in said margin area within one of adjacent subfields on said mask.

5. A charged particle beam exposure method as set forth in claim 3, further comprising forming a small pattern around the boundary of said subfields within one of the adjacent subfields without dividing said small pattern.

6. A charged particle beam exposure method as set forth in claim 4, further comprising forming a small pattern around a boundary of said subfields on one of the adjacent subfields without dividing it.

* * * * *